(12) United States Patent
Maloney et al.

(10) Patent No.: US 9,871,176 B2
(45) Date of Patent: Jan. 16, 2018

(54) GLASS COMPOSITIONS AND GLASS FRIT COMPOSITES FOR USE IN OPTICAL APPLICATIONS

(71) Applicant: Ferro Corporation, Mayfield Heights, OH (US)

(72) Inventors: John J. Maloney, Solon, OH (US); Srinivasan Sridharan, Strongsville, OH (US); Jackie D. Davis, Cleveland, OH (US); Gregory R. Prinzbach, Brecksville, OH (US); George E. Sakoske, Independence, OH (US)

(73) Assignee: Ferro Corporation, Mayfield Heights, OH (US)

( * ) Notice: Subject to any disclaimer, the term of this patent is extended or adjusted under 35 U.S.C. 154(b) by 0 days.

(21) Appl. No.: 15/007,364

(22) Filed: Jan. 27, 2016

(65) Prior Publication Data

US 2016/0225966 A1    Aug. 4, 2016

Related U.S. Application Data

(60) Provisional application No. 62/110,652, filed on Feb. 2, 2015.

(51) Int. Cl.
*H01L 21/00* (2006.01)
*H01L 33/58* (2010.01)
(Continued)

(52) U.S. Cl.
CPC .............. *H01L 33/58* (2013.01); *C03C 3/093* (2013.01); *C03C 3/095* (2013.01); *C03C 4/12* (2013.01);
(Continued)

(58) Field of Classification Search
CPC ....... H01L 33/502; H01L 33/50; H01L 33/58; H01L 51/107; H01L 51/5262; H01L 51/5281
(Continued)

(56) References Cited

U.S. PATENT DOCUMENTS 3,690,908 A    9/1972    Greco et al.
4,732,875 A    3/1988    Sagara
(Continued)

FOREIGN PATENT DOCUMENTS

EP        0496963 A1    8/1992

OTHER PUBLICATIONS

Fujita et al., "Luminescence Characteristics of YAG Glass-Ceramic Phosphor for White LED," IEEE Journal of Selected Topics in Quantum Electronics, vol. 14, No. 5, Sep./Oct. 2008, pp. 1387-1391.
(Continued)

*Primary Examiner* — Thien F Tran
(74) *Attorney, Agent, or Firm* — Rankin, Hill & Clark LLP (57) ABSTRACT

The glass composites include glass frit, that when sintered produce a phosphor-containing layer, suitable for use in optical applications. The glass composites can include a crystallizing glass frit, such that phosphor crystals precipitate from the frit composite during sintering, or can include a non-crystallizing glass composition, such that phosphor is added to the frit composite before sintering. The sintering temperatures of the glass are relatively low so that fluorescence of the phosphors will not substantially degrade during sintering. The resulting phosphor-containing layer can be used in various optical applications including those for converting blue light into various color temperatures of white light.

18 Claims, 1 Drawing Sheet

(51) Int. Cl.

| | | |
|---|---|---|
| *C03C 3/093* | (2006.01) | |
| *C03C 3/095* | (2006.01) | |
| *C03C 4/12* | (2006.01) | |
| *C03C 8/04* | (2006.01) | |
| *C03C 8/14* | (2006.01) | |
| *C03C 10/00* | (2006.01) | |
| *C03C 14/00* | (2006.01) | |
| *H01L 33/50* | (2010.01) | |
| *H01L 51/52* | (2006.01) | |

(52) U.S. Cl.
CPC ............... *C03C 8/04* (2013.01); *C03C 8/14* (2013.01); *C03C 10/0054* (2013.01); *C03C 14/006* (2013.01); *H01L 33/502* (2013.01); *H01L 51/5262* (2013.01); *H01L 51/5281* (2013.01); *C03C 2214/16* (2013.01); *H01L 2933/0033* (2013.01); *H01L 2933/0041* (2013.01); *H01L 2933/0058* (2013.01)

(58) Field of Classification Search
USPC .................. 257/98, 794; 438/26, 22, 27
See application file for complete search history.

(56) References Cited

U.S. PATENT DOCUMENTS

| | | | |
|---|---|---|---|
| 5,070,065 A | 12/1991 | Muan et al. | |
| 5,179,065 A | 1/1993 | Ito | |
| 5,256,600 A | 10/1993 | Pfitzenmaier | |
| 5,346,933 A | 9/1994 | Knell | |
| 5,387,558 A | 2/1995 | Grossman | |
| 5,411,768 A | 5/1995 | Knell et al. | |
| 5,670,086 A | 9/1997 | Papadopoulos et al. | |
| 6,656,859 B2 | 12/2003 | Aitken et al. | |
| 7,001,943 B2 | 2/2006 | Yuan et al. | |
| 7,157,119 B2 | 1/2007 | Tang et al. | |
| 7,670,683 B2 | 3/2010 | Mallozzi et al. | |
| 2002/0013207 A1 | 1/2002 | Frey et al. | |
| 2002/0058144 A1 | 5/2002 | Mori et al. | |
| 2005/0025891 A1 | 2/2005 | Tang et al. | |
| 2006/0235111 A1 | 10/2006 | Tang et al. | |
| 2007/0087118 A1 | 4/2007 | Tang et al. | |
| 2008/0030976 A1* | 2/2008 | Murazaki | C03C 3/064 362/84 |
| 2008/0035887 A1* | 2/2008 | Iwao | C03C 3/068 252/301.4 F |
| 2008/0121911 A1 | 5/2008 | Andrews et al. | |
| 2009/0276869 A1 | 11/2009 | Boerboom | |
| 2012/0107622 A1 | 5/2012 | Borrelli et al. | |
| 2012/0235200 A1 | 9/2012 | Thompson et al. | |
| 2013/0256598 A1 | 10/2013 | Aitken et al. | |
| 2014/0152173 A1 | 6/2014 | Oshio et al. | |
| 2016/0225966 A1* | 8/2016 | Maloney | H01L 33/502 |
| 2016/0347644 A1* | 12/2016 | Dabich, II | C03B 37/005 |

OTHER PUBLICATIONS

Wang et al., "Crystallization and fluorescence properties of Ce:YAG glass-ceramics with low $SiO_2$ content," Journal of Luminescence,136 (2013) pp. 378-382.

"Considerations for Blending LED Phosphors," Applications Note from Intematix, Jan. 2013, eight pages.

Yi et al., "Stable and Color-Tailorable White Light from Blue LEDs Using Color-Converting Phosphor-Glass Composites," J. Am. Ceram. Soc. 97 [2] pp. 342-345 (2014).

Smet et al., "Selecting conversion phosphors for white light-emitting diodes," Journal of the Electrochemical Soc. 158 (2011) 82 pages.

Li et al., "Crystallization and microstructures of Y—Si—Al—O—N glass-ceramics containing main crystal phase $Y_3Al_5O_{12}$," Bull. Mater. Sci., vol. 34, No. 4, Jul. 2011, pp. 767-774.

Espacenet bibliographic data for EP0496963 published Aug. 5, 1992, two pages.

Setlur "Phosphors for LED-based Solid-State Lighting," The Electrochemical Society Interface, Winter 2009, pp. 32-36.

Li et al., "The development of $Ce^{3+}$-activated (Gd, Lu)$_3Al_5O_{12}$ garnet solid solutions as efficient yellow-emitting phosphors," Sci. Technol. Adv. Mater. 14 (2013) nine pages.

* cited by examiner

GLASS COMPOSITIONS AND GLASS FRIT COMPOSITES FOR USE IN OPTICAL APPLICATIONS

FIELD

The present subject matter relates to glass compositions containing phosphor for use in optical, glass color applications and related methods.

BACKGROUND

Transparent layers and compositions are often used in optical applications, wherein light is transmitted through a layer of transparent material for viewing. Several factors are often considered in formulating such transparent layers for specific applications. These factors include for example, optimizing the percent transmission of light through the transparent layer, and increasing the functionality of the transparent layer for altering, e.g. upconverting or polarizing, the light as it passes through the transparent layer. Transparent layers are typically used in various optical applications such as display screens in televisions and smartphones, and light emitting diodes (LEDs), for example. Due to much lower power consumption and longer life compared to other lighting sources, LEDs are increasingly utilized in demanding lighting applications such as automotive headlights and residential lighting. The conversion to using LEDs is due to advances in producing high brightness blue LEDs, which generally emit more lumens per watt than LEDs emitting other colors (e.g. red, orange, yellow, and green).

One disadvantage of using high output blue LEDs as general purpose lighting is that blue LEDs undesirably emit a cold blue light. Therefore, development of blue LEDs has partially focused on converting the blue light to white light having different color temperatures, e.g. cool white light (blueish hue with color temperature ~10000° K.) to warm white light (yellowish hue with color temperatures ~3000° K.).

One method of converting blue light from an LED to white light is by transmitting the blue light through a phosphor material capable of emitting yellow light. The conversion from blue to white light proceeds when a portion of the blue light from the LED chip is absorbed by the phosphor material and the absorbed energy excites the phosphor and causes the phosphor to emit yellow light. The yellow light emitted from the phosphor combines with an unabsorbed portion of the blue light transmitted through the phosphor material, to produce white light of varying color tones.

A phosphor material used to produce white light from a blue LED is an aluminum garnet structure, in particular $Ce^{3+}$ doped Yttrium Aluminum Garnet (YAG) crystals represented by the chemical formula $Y_3Al_5O_{12}$. This and other phosphors are being used in LED packages that include an organic silicone polymer encapsulant that surrounds the LED chip. The phosphor is included in the form of a disc covering the organic silicone, or is dispersed into a silicone polymer matrix and formed into a composite dome or encapsulant for the LED chip.

However, the organic silicone used as the matrix material for the LED package tends to degrade over time from exposure to light and heat produced by the LED chip. Such degradation of the silicone results in undesirable discoloration of the silicone and reduces the output, and hence the useful lifetime, of the LED package.

In the case of $Ce^{3+}$ doped YAG phosphor, which are dispersed in the silicone dome/encapsulant, blue LED chips emit light at ~460 nm wavelength. This light goes through the silicone-phosphor material. The phosphor absorbs part of this blue light and due to fluorescence, emits yellow light in a broad band centered around 550 nm. The blue light (~460 nm) transmitted through the silicone-phosphor material is mixed with the yellow light (~550 nm) emitted by the phosphor, and thereby produces white light. In general this white light has an undesirable cool color temperature.

In this regard, the white light emitted by the LED package has an undesirable cool color temperature (i.e. blueish), instead of a desired warm color temperature (i.e. yellowish) similar to traditional incandescent light bulbs. Further, organic silicone used as a polymer matrix degrades during the lifetime of the LED, causing a shift in color shade and/or output of the LED package and thereby decreases the useful lifetime of the LED package. Therefore an improvement in the technology is needed.

In order to produce warm white light, additional red shift is needed from the phosphor. For this, various phosphor technologies, such as mixing of different yellow and red phosphors, and phosphors based on host crystals other than YAG, such as La—AG, Gd—AG, Lu—AG, nitrides and oxynitrides, oxides, oxyhalides and halides are being pursued with different activators such as $Ce^{3+}$, $Eu^{2+}$, $Yb^{2+}$ so on.

Although satisfactory in certain respects, a need remains for an improved white light emitting LED package and phosphor-containing layers in other applications. In particular, it would be desirable to ensure that the matrix material in which the phosphor is dispersed has improved resistance to degradation, such as yellowing or causing a shift in color shade or output.

SUMMARY

The difficulties and drawbacks associated with previous approaches are addressed in the present subject matter as follows.

In one aspect, the present subject matter provides a method of making a light emitting diode package. The method includes sintering a glass frit composite to form a phosphor-containing layer comprising phosphor dispersed in a glass matrix. The phosphor-containing layer is positioned, such that light from a light emitting diode is transmitted through the phosphor-containing layer. The glass frit composite includes glass frit formed by firing a mixture including about 20-60 mole % $SiO_2$, about 14-50 mole % ZnO, and about 3-28 mole % $B_2O_3$.

In another aspect, the present subject matter provides a light emitting diode package comprising a phosphor-containing layer through which light from a light emitting diode is transmitted. The phosphor-containing layer comprises a sintered glass frit composite that includes phosphor dispersed in a glass matrix. The glass frit composite including a glass frit. The glass frit comprises, prior to firing about 20-60 mole % $SiO_2$, about 14-50 mole % ZnO, about 3-28 mole % $B_2O_3$, about 1-21 mole % $K_2O$, about 1-25 mole % $Na_2O$, up to 25 mole % BaO+MgO+CaO+SrO, up to 60 mole % $Bi_2O_3$+$TeO_2$+$Ta_2O_5$+$Nb_2O_5$+$P_2O_5$+$V_2O_5$, up to 25 mole % $La_2O_3$+$Lu_2O_3$+$Pr_2O_3$+$Gd_2O_3$+$Tb_2O_3$+$Eu_2O_3$, up to 25 mole % $TiO_2$+$ZrO_2$, up to 25 mole % $Sb_2O_3$+$CeO_2$+$SnO_2$, up to 20 mole % $Li_2O$+$Cs_2O$+$Rb_2O$, up to 40 mole % $Y_2O_3$+$Al_2O_3$, and up to 25 mole % of anions of F+S+Se.

As will be realized, the subject matter described herein is capable of other and different embodiments and its several details are capable of modifications in various respects, all without departing from the claimed subject matter. Accordingly, the drawings and description are to be regarded as illustrative and not restrictive.

DETAILED DESCRIPTION OF THE EMBODIMENTS

The present subject matter provides glass compositions that can be sintered and used for producing a phosphor-containing layer comprising phosphor dispersed in a glass matrix. The phosphor-containing layer can be used for any purpose in any application, including in a variety of optical applications, and such use is not particularly limited by the present subject matter. For example, the phosphor-containing layer can be used in applications including optical devices, upconversion devices and applications, backlighting applications, optical communication applications, as glass enamels, as functional coating layers, incorporated into architectural windows, smart windows, display screens on electronic devices (televisions, computers, smartphones), or incorporated into a LED package for converting blue light emitted from a blue LED chip, to white light of various color temperatures. The phosphor-containing layer can also be used in conjunction with one or more other phosphor-containing layers to form multi-layer phosphor-containing structures. Additionally, colored coatings and compositions are often used in applications such as where the color properties in reflected light are important. The glass compositions of this invention can be used with phosphors to attain desired color properties.

In several embodiments, the glass composition can act as a continuous matrix material in which phosphor material is dispersed. Such glass compositions will be referred to herein as "non-crystallizing" glass compositions/frit. In embodiments utilizing non-crystallizing compositions, phosphor may be mixed with the glass frit before sintering of the glass frit.

In other embodiments the glass composition acts as a source material from which phosphor crystals are precipitated out as glass-ceramic material. Such glass compositions will be referred to herein as "crystallizing" glass compositions/frit. In embodiments utilizing crystallizing compositions, precipitation of phosphor may occur during sintering, or other heat treatment, of the glass frit.

The glass compositions can be used, for example, to form a phosphor-containing layer that is placed over a blue LED chip for converting the blue light from the LED chip into white light. In several embodiments, the phosphor-containing layer is included as a glass cover disc that is remote from the LED chip. In other embodiments the phosphor-containing layer is included as an encapsulant that is in intimate contact with the LED chip.

In accordance with the present subject matter, the glass compositions are compatible with and/or precipitate various types of phosphors, or mixtures of different phosphors. In LED applications, the glass compositions including phosphor can be used to provide wider color temperatures of white light from a blue LED package. Furthermore, the glass compositions can be used to form a phosphor-containing layer that includes a durable glass matrix that does not discolor when subject to light and heat from a LED chip, for example. Because of this, the phosphor-containing layer of the present subject matter can replace or supplement the organic silicone that is conventionally used in LED packages, which is subject to degradation. As previously mentioned, the phosphor-containing layer can be used in optical applications other than in LED packages.

It should, of course, be understood that the description and drawings herein are merely illustrative and that various modifications and changes can be made in the structures disclosed without departing from the present disclosure. In general, the figures of the exemplary phosphor-containing layer are not necessarily to scale. It will also be appreciated that the various identified components of the exemplary phosphor-containing layer disclosed herein are merely terms of art that may vary from one manufacturer to another and should not be deemed to limit the present disclosure.

Various exemplary configurations of LED packages including a phosphor-containing layer will now be described in more detail with references to FIGS. 1-3. It will be understood the figures are merely illustrative and that the present subject matter includes other configurations for an LED package and phosphor-containing layer. It will also be understood that the description provided herein of incorporating a phosphor-containing layer into an LED package, will also apply to incorporating a phosphor-containing layer into any other optical device or application listed herein.

Figure 1:
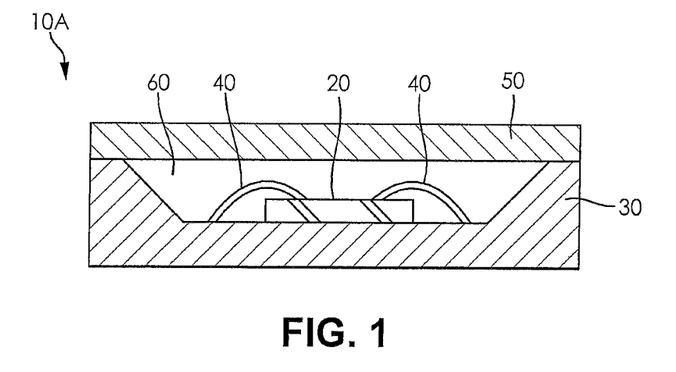
FIG. 1 is a cross-sectional view of a light emitting diode package in accordance with the present subject matter.

As seen in FIG. 1, an LED package 10A includes a LED chip 20 on a substrate 30. The LED chip 20 is connected by wire bonds 40 to a power source (not shown). The LED package 10A includes a phosphor-containing layer 50 as a cover layer over the LED chip 20, through which light from the LED chip 20 is transmitted and converted from blue light to white light of various color temperatures. The phosphor-containing layer 50 may be sealed to the substrate 30 to provide a vacuum/inert atmosphere 60 around the LED chip 20 and wire bonds 40.

Figure 2:
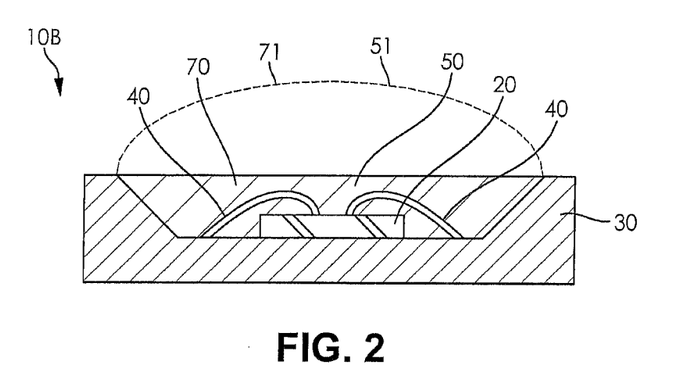
FIG. 2 is a cross-sectional view of a light emitting diode package in accordance with the present subject matter.

In another embodiment shown in FIG. 2, an LED package 10B includes a LED chip 20 on a substrate 30, which is connected by wire bonds 40 to a power source (not shown). The LED package 10B includes a phosphor-containing layer 50 as an encapsulant for the LED chip 20 and wire bonds 40. Light from the LED chip 20 is transmitted through the phosphor-containing layer 50 and converted by the phosphor-containing layer 50 from blue light to white light of various color temperatures. In one aspect, the phosphor-containing layer 50 may be in the shape of a dome 51 as shown.

Figure 3:
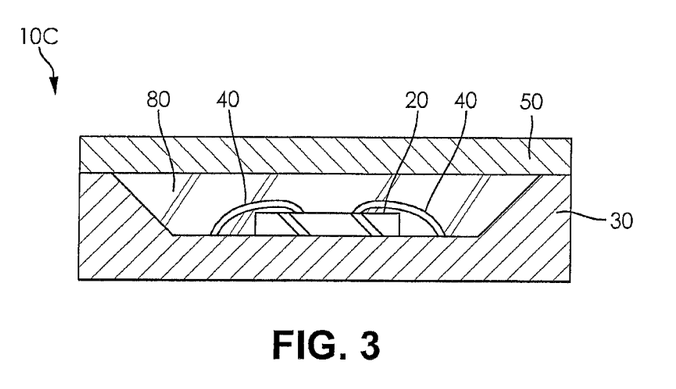
FIG. 3 is a cross-sectional view of a light emitting diode package in accordance with the present subject matter.

In another embodiment shown in FIG. 3, an LED package 10C includes a LED chip 20 on a substrate 30, which is connected by wire bonds 40 to a power source (not shown). The LED package 10C includes a phosphor-containing layer 50 as a cover layer over the LED chip 20. The phosphor-containing layer 50 lies over an encapsulant material 80 that encapsulates the LED chip 20 and wire bonds 40. The encapsulant material 80 may include organic silicone as is conventionally used. Light from the LED chip 20 is transmitted through the encapsulant material 80 and through the phosphor-containing layer 50 and converted by the phosphor-containing layer 50 from blue light to white light of various color temperatures.

The various aspects of the present subject matter will now be described in more detail.

Glass Composition

In accordance with the present subject matter, the glass composition included in the phosphor-containing layer is configured to provide a highly durable glass matrix containing phosphor that does not discolor upon exposure to light or heat, such as light and heat from an LED chip, for example. In several embodiments, the glass compositions are produced by firing a mixture of oxides, which are combined and melted at high temperatures to form a molten mixture of oxides. The molten oxides are then quenched to form the glass compositions.

In several embodiments, the glass compositions are in the form of glass frit, wherein the quenched glass composition is modified, such as by milling or grinding, to form glass frit of a desired size, typically 1-50 μm, preferably 3-30 μm, more preferably 3-20 μm, and most preferably a mixture of different sizes within 1-50 μm.

In certain compositional ranges, the glass composition includes a crystallizing glass, wherein mixing of a separate phosphor may not be required to produce a phosphor-containing layer. In other compositional ranges, the glass composition includes a non-crystallizing glass, wherein a separate phosphor may be included to produce a phosphor-containing layer. In one aspect, separate phosphor is added to crystallizing frit to produce a phosphor-containing layer. For these crystallizing and non-crystallizing glass compositions, different compositional ranges for the glass can be optimized. It will be understood that the disclosed glass systems can include one or both of these functionalities.

In accordance with the present subject matter, the glass frit is used in a phosphor-containing layer. In one embodiment, the glass frit can be added to a conventional LED encapsulant material comprising phosphor dispersed in an organic polymer matrix. Such addition may improve durability (e.g. reduce discoloration or degradation) of the conventional polymer matrix material used as an LED encapsulant. In another embodiment, phosphor can be dispersed in the glass frit to define a phosphor-containing material. In another embodiment, the phosphor can be precipitated from the glass frit during sintering to define a phosphor-containing material. The phosphor-containing material or glass frit composite can be formed into a phosphor-containing layer comprising phosphor dispersed in a glass matrix, or the phosphor-containing material can be dispersed in a conventional organic polymer matrix that optionally includes additional phosphor. The phosphor-containing layer can be formed by sintering glass frit by heating the frit above its glass transition temperature (Tg). However, exposing phosphors to relatively high processing temperatures (e.g. more than about 900° C.) may degrade the fluorescence of the phosphor. In this regard and in one embodiment, the glass composition is formulated so that the glass frit can be processed (e.g. sintered) at relatively low temperatures (e.g. less than about 900° C.) to form the phosphor-containing layer. Such low temperature processing may inhibit degradation of the fluorescent properties of the phosphor that may be present in the glass compositions. In one embodiment, the glass frit has sintering or firing temperatures of less than about 900° C., less than about 850° C., less than 750° C., or less than 650° C.

A variety of firing or sintering techniques may be employed, many of which with a view to keep processing temperatures as low as possible. Conventional furnace firing may be used. Fast-fire or localized-fire techniques such as laser firing, microwave heating, induction heating or hot isostatic pressing may be used.

Localized or dispersed energy sources can be used to sinter the phosphor dispersed in a glass matrix. i.e., glass frit. Suitable localized energy sources include UV, visible light, broadband infrared curing or heating sources, laser, flame induction, or combinations thereof. Dispersed energy sources include thermal curing, ultrasound, natural gas burners, magnetic induction and eddy current heating sources.

The firing atmosphere can be ambient air, a low oxygen atmosphere, an oxygen free atmosphere such as $N_2$ or $N_2H_2$, He, or Ar. Other procedures may be undertaken to exclude oxygen from an encapsulated LED such as pressing pellets of a green body as disclosed elsewhere herein. The particle size distribution of the glass frit is not particularly limited by the present subject matter and can range from coarse to fine, or can be a mixture of different populations of coarse and fine glass frit. In one embodiment, the glass frit comprises particles having a D50 particle size distribution of from about 1-50 μm, from about 3-30 μm, or can include one or more populations of glass frit particles having different D50 measurements. In accordance with the present subject matter, the glass frit can have a D50 particle size distribution of about 3 μm, about 9 μm, about 15-30 μm, or a combination thereof.

The glass composition is not particularly limited by the present subject matter, and can include oxides that upon firing, form alkali-B—Si—Zn glasses, bismuth-based glasses, lead-based glasses, or alkali-B—Si glasses for example. The fired glass composition can be clear or colored.

In several embodiments, the oxide mixture used to form the glass compositions comprises a mixture of oxides comprising $ZnO$—$B_2O_3$—$SiO_2$. When fired, these oxides form zinc borosilicate glass compositions generally having a refractive index of about 1.55-1.60. In one embodiment, the mixture of oxides includes about 14-50 mole % $ZnO$, about 3-28 mole % $B_2O_3$, and about 20-60 mole % $SiO_2$.

In accordance with the present subject matter, additional oxides can be included as follows:

up to about 21 mole % $K_2O$, up to about 25 mole % $Na_2O$, and/or up to about 20 mole % of other alkali oxides;

up to about 25 mole % alkaline earth oxides such as BaO, SrO, MgO, CaO, to stabilize glass without increasing the alkali oxides content, and particularly BaO, to increase the refractive index of the glass composition without increasing the temperature necessary for sintering the glass frit;

up to about 5 mole % $Sb_2O_3+CeO_2+SnO_2$, to make the glass composition clear without coloring it;

up to about 40 mole % $Al_2O_3+Y_2O_3$, for producing a crystallizing glass composition;

up to about 25 mole % $La_2O_3$, to increase the refractive index of the glass composition, to produce clear glass, and in special cases to crystallize La—AG phosphor;

up to 25 mole % of $La_2O_3+Lu_2O_3+Gd_2O_3+Tb_2O_3+Eu_2O_3+Pr_2O_3$, for producing a crystallizing glass that precipitates garnets with various red color temperature shifts, and particularly $Pr_2O_3$ to provide residual yellow color in the glass matrix itself;

up to about 60 mole % $Bi_2O_3$, $TeO_2$, $Ta_2O_5$, $Nb_2O_5$, $P_2O_5$, to increase the refractive index of the glass composition, particularly $TeO_2$ and $Bi_2O_3$; and up to 25 mole % $TiO_2+ZrO_2$; to increase the refractive index of the glass composition and to increase the durability of the glass composition.

The present subject matter also includes the additions of anions (preferentially F, S and Se) to oxygen sites in the glass composition to modulate optical properties, such as transparency, refractive index (RI), and reactivity with phosphors. Throughout the specification and claims, in all cases, for all tables and for all embodiments, when a range is indicated as being bounded by zero on the lower end, or a component is indicated as being included "up to" or "≤" a specified mole %, these provides support for the same range bounded by 0.01 or 0.1 at the lower end, or a component being included from 0.01 or 0.1 mole % up to the specified upper limit for mole %. In a recitation of a group of ingredients, such as "up to 25 mole % $La_2O_3+Lu_2O_3+Pr_2O_3+Gd_2O_3+Tb_2O_3+Eu_2O_3$," the recitation also provides support for 0.01-25 mol % or 0.1 -25 mol % of the recited group of ingredients as well as such ranges of each individual ingredient in the group (e.g., 0.01-25 mol % $Lu_2O_3$ or 0.1-25 mol % $Gd_2O_3$) and any combination thereof.

In several embodiments, the glass composition is formed by firing a mixture of oxides comprising about 20-60 mole % $SiO_2$, 14-50 mole % ZnO, 3-28 mole % $B_2O_3$, and 1-21 mole % $K_2O$. In addition, the oxides can comprise about 1-25 mole % $Na_2O$; up to 20 mole % ($Li_2O+Cs_2O+Rb_2O$); up to 25 mole % (BaO+MgO+CaO+SrO); up to 5 mole % ($Sb_2O_3+CeO_2+SnO_2$) as decolorizer; up to 40 mole % ($Y_2O_3+Al_2O_3$) especially for crystallizing compositions; up to 25 mole % ($La_2O_3+Lu_2O_3+Pr_2O_3+Gd_2O_3+Tb_2O_3+Eu_2O_3$) as a modifier for precipitating different garnets as well as to increase the refractive index of glass, in this $La_2O_3$ is unique as it promotes all three functions of crystallization, giving clear glass, and increase the refractive index; up to 25 mole % ($TiO_2+ZrO_2$) for durability and increasing refractive index; and up to 25 mole % of anion modifiers, preferably F+S+Se, of these Fluorine (F) is most preferred.

Furthermore, the oxides can include up to 60 mole % of $Bi_2O_3$; up to 50 mole % $TeO_2$; and up to 50 mole % of pentavalent oxides such as ($Ta_2O_5+Nb_2O_5+P_2O_5+V_2O_5$) as refractive index enhancers. In one embodiment, the mixture of oxides is free of $V_2O_5$ due to hazardous nature of vanadium pentoxide raw material.

In one embodiment, the glass composition is produced by firing a mixture comprising 33-50 mole % $SiO_2$, 15-20 mole % ZnO, 16-21 mole % $B_2O_3$, 2-5 mole % $K_2O$, 3-7 mole % $Na_2O$, up to 8 mole % or 0.1-8 mole% $Li_2O$, up to 20 mole % or 0.5-20 mole % BaO, up to 6 mole %, up to 5 mole %, 0.1-5 mole %, or 0.1-1.0 mole % $Sb_2O_3$, and up to 19 mole % or 0.7-19 mole % $Al_2O_3$.

In several embodiments, the oxides and glass compositions are free of intentionally added lead-containing oxide or lead.

In accordance with the present subject matter, Table 1 below provides a summary of several exemplary glass compositions A-G, and lists for each glass composition, the mole % of various oxides prior to firing. Ranges from different columns A-G can be used to formulate a glass composition in accordance with the present subject matter.

TABLE 1

Mole % of Oxides by Glass Composition Prior to Firing

| Oxides | Glass Composition | | | | | | |
|---|---|---|---|---|---|---|---|
| | A | B | C | D | E | F | G |
| $SiO_2$ | 20-60 | 33-55 | 42-50 | 33-55 | 33-55 | 33-55 | 33-55 |
| ZnO | 14-50 | 15-35 | 15-20 | 15-35 | 15-35 | 15-35 | 15-35 |
| $B_2O_3$ | 3-28 | 5-25 | 16-21 | 5-25 | 5-25 | 5-25 | 5-25 |
| $K_2O$ | 1-21 | 2-18 | 2-5 | 2-18 | 2-18 | 2-18 | 2-18 |
| $Na_2O$ | 1-25 | 2-21 | 3-7 | 2-21 | 2-21 | 2-21 | 2-21 |
| $Li_2O + Cs_2O + Rb_2O$ | 0-20 | 0.1-15 | 0.1-8 | 0.1-15 | 0.1-15 | 0.1-15 | 0.1-15 |
| BaO + MgO + CaO + SrO | 0-25 | 0.1-22 | 0.5-20 | 0.1-22 | 0.1-22 | 0.1-22 | 0.1-22 |
| $Sb_2O_3 + CeO_2 + SnO_2$ | 0-5 | 0.1-5 | 0.1-0.6 | 0.1-5 | 0.1-5 | 0.1-5 | 0.1-5 |
| $Al_2O_3$ | 0.1-40 | 0.1-31 | 0.7-19 | 0.1-40 | 0.7-31 | 3-23 | 0.1-40 |
| $Y_2O_3$ | ≤40 | | | ≤40 | 1-35 | 3-23 | ≤40 |
| $La_2O_3 + Lu_2O_3 + Gd_2O_3 + Tb_2O_3 + Eu_2O_3 + Pr_2O_3$ | ≤25 | | | ≤25 | 0.1-25 | 3-18 | ≤25 |
| $Bi_2O_3$ | ≤60 | | | 14-70 | ≤75 | ≤60 | ≤60 |
| $TeO_2$ | ≤50 | | | ≤30 | ≤40 | ≤50 | 10-48 |
| $TiO_2 + ZrO_2$ | ≤25 | | | | | | |
| $Ta_2O_5 + Nb_2O_5 + P_2O_5 + V_2O_5$ | ≤50 | | | | | | |
| F + S + Se | ≤25 | 05-15 | | ≤25 | ≤25 | ≤25 | ≤25 |

In one aspect, the oxides may be fired and quenched to produce a non-crystallizing or crystallizing glass composition, which can then be sized, such as by milling or grinding, to form glass frit. In embodiments including non-crystallizing frit, phosphor can be mixed at 5-95 weight % with the glass frit prior to forming the phosphor-containing layer. In several embodiments, such as when incorporated into a blue LED package, the amount of phosphor should be sufficient, with respect to the thickness of the phosphor-containing layer, for emitting white light of the desired color temperature and intensity.

The phosphor that is either added to, or precipitated from, the glass composition is not particularly limited by the present subject matter and can comprise $Ce^{3+}$ doped garnet phosphors, nitride and oxynitride phosphors, and oxide, oxyhalide and halide phosphors; including, but is not limited to: $Y_3Al_5O_{12}:Ce^{3+}$ (Ce:YAG); $Y_3Al_5O_{12}:Ce^{3+}$, $CaS:Eu_{2+}$; $Y_3Al_5O_{12}:Ce^{3+}$, $Sr_2Si_5N_8:Eu^{2+}$; $Sr_2GaS_4:Eu^{2+}$, $SrS:Eu^{2+}$; $Sr_2GaS_4:Eu^{2+}$, $(Ca,Sr)S:Eu^{2+}$; $Ca_3Sc_2Si_3O_{12}:Ce^{3+}$, $CaAlSiN_3:Eu^{2+}$; $SrSi_2O_2N_2:Eu^{2+}$, $Sr_2Si_5N_8:Eu^{2+}$; $SrSi_2O_2N_2:Eu^{2+}$, $CaSiN_2:Ce^{3+}$; $(Sr,Ca)_3(Al,Si)O_4(O,F):Ce^{3+}$, $K_2TiF_6:Mn4+$; $BaSi_2O_2N_2:Eu^{2+}$, $\beta$-SiAlON:$Eu^{2+}$, Ca-$\alpha$-SiAlON:$Eu^{2+}$, $CaAlSiN_3:Eu^{2+}$; $BaSi_2O_2N_2:Eu^{2+}$, $\beta$-SiAlON:$Eu^{2+}$, Ca-$\alpha$-SiAlON:$Eu^{2+}$, $CaAlSiN_3:Eu^{2+}$; $BaMgAl_{10}O_{17}:Eu^{2+}$, $Ca_9La(PO_4)_7:Eu^{2+}$, $Mn^{2+}$; $CaSi_2O_2N_2:Eu^{2+}$; $Sr_5Al_{5+x}Si_{21-x}N_{35-x}O_2+x:Eu^{2+}$(with x~0); $SrAlSi_4N_7:Eu^{2+}$; $Ba_2AlSi_5N_9:Eu^{2+}$; $Ba_3Si_6O_{12}N_2:Eu^{2+}$; $Ba_2SiO_4:Eu^{2+}$; $Sr_2LaAlO_5:Ce^{3+}$; $Sr_3SiO_5:Ce^{3+}$; $M_2SiO_4:Eu^{2+}$ (with M=$Ba^{2+}$, $Sr^{2+}$, $Ca^{2+}$); and combinations thereof.

The size of the phosphor particles (e.g. crystals) are not particularly limited by the present subject matter, and can range from about 5-30 μm. Smaller size phosphor crystals may dissolve in the glass matrix to a greater extent upon being exposed to sintering temperatures, and thus blue light from an LED chip for example, may not be adequately converted to yellow light.

Conversely, larger phosphor particles may not adequately fill up the bulk of the phosphor-containing layer, wherein the thickness of the phosphor-containing layer is relatively small compared to the size of the phosphor particles, and therefore the phosphor-containing layer may average only a single layer of phosphor particles in cross-section, and therefore have a significant fraction of cross-section void of phosphor. Such an arrangement may result in a large percentage of blue light from a blue LED chip being transmitted directly through the phosphor-containing layer, between the phosphor particles, without being absorbed by the phosphor and without being converted to yellow light. The light emitted from such an LED package may undesirably have a cold color temperature.

In several embodiments, the size of the phosphor particles relative to the thickness of the phosphor-containing layer is such that the phosphor-containing layer includes 1-10 layers of phosphor particles. This arrangement increases the probability that a large portion of the blue light from the LED chip will be absorbed in at least one layer of phosphor particles and be converted to yellow light.

The refractive index of the phosphor particles is also not particularly limited by the present subject matter, and may be the same as the RI of the glass matrix, or may differ by about ±0.01-0.3. In one embodiment, the refractive index of the phosphor is about 1.7 and the RI of the glass matrix is about 1.5-1.6. In this embodiment, the light from the LED chip may not simply travel in a straight line though the phosphor containing layer, only being absorbed by the phosphor particles that lie in that particular line of travel. Rather, a portion of the light may be reflected or refracted within the phosphor-containing layer at the glass matrix/phosphor interfaces. Such reflection and refraction are dependent on the difference in RI between the glass matrix and the phosphor. The reflected portion of the light may thereby diverge along a longer, more tortuous path within the phosphor-containing layer and at different angles from the incident ray. Accordingly, the light from the LED chip has more opportunity to encounter and be absorbed by phosphor particles within the phosphor-containing layer and to be converted to yellow light.

Types of Glass

When fired, the various oxides disclosed herein produce glass compositions comprising non-crystallizing glass compositions or crystallizing glass compositions. Non-crystallizing and crystallizing glass compositions can be ground into frit, mixed with phosphors, and shaped to form a green (i.e. not sintered) body. The green body is then sintered to form a phosphor-containing layer comprising phosphor dispersed in a glass matrix. Crystallizing glass compositions can be ground into frit, shaped to form a green body, and sintered under a particular heating schedule such that phosphor crystals, comprising for example, aluminates of Y, La, Lu, Pr, Gd, Tb, and Eu, precipitate in the sintered phosphor-containing layer. The non-crystallizing and crystallizing glass frit can be used as a separate layer in a LED package, or dispersed into a conventional LED encapsulant comprising phosphors dispersed in a polymer matrix, e.g. organic silicone.

In another embodiment, glass compositions that precipitate non-phosphor crystals are used. In this embodiment, the glass frit can be mixed with phosphors similarly to embodiments including non-crystallizing glasses, but here the glass compositions precipitate non-phosphor crystals that may be useful for providing certain characteristics to the sintered product, such as improved refractive index matching to, or differentiation from, the mixed phosphors.

In all of these embodiments, the phosphors can comprise for example, yellow phosphors having different red color temperature shifts producing different color temperature white light when irradiated with blue light from blue LEDs.

In embodiments utilizing a non-crystallizing glass composition, the glass composition may perform similar functions as the matrix of organic silicone in conventional LED packages. However, the glass compositions of the present subject matter possess the added advantage of having higher temperature stability and more resistance to weathering than silicone.

In embodiments utilizing a crystallizing glass composition, one advantage is that these glass compositions have a lower temperature of crystallization compared to conventional glass-ceramic phosphors, and thus do not degrade the fluorescence of the phosphor as much as in conventional glass-ceramic phosphors. More specifically, the processing temperatures of the crystallizing glass composition of the present subject matter are relatively low, e.g. less than about 1050° C. In contrast, conventional glass-ceramic phosphors have temperatures of the crystallization greater than 1050° C., wherein Ce doped YAG crystals may be precipitated in $Y_2O_3$—$Al_2O_3$—$SiO_2$ glass systems. Such high temperature processing has several disadvantages, for example (a) the high temperature processing requires more energy and is therefore more costly; (b) the high temperature processing may degrade the fluorescence of the phosphors; and (c) precipitated phosphors conventionally only produce minimal red shifts, thus resulting in only cool color temperatures of white light.

In contrast, the present subject matter provides differently doped YAG crystals that produce warm color temperatures of white light and at lower processing temperatures of less than 1050° C., more preferably at temperatures less than 900° C., out of these alkali-ZnO—$B_2O_3$—$SiO_2$ based glass systems.

A similar advantage is also realized in the non-crystallizing glass compositions of the present subject matter, wherein these compositions have lower processing temperatures compared to other non-lead-containing glass compositions that may be used as the glass matrix, and thus minimize degradation of the fluorescence of the phosphor.

In either the crystallizing or non-crystallizing glass compositions used to produce the phosphor-containing layer, the refractive index (RI) of the glass matrix can be tailored (RI≈1.5 to 2.0) to more closely match that of the phosphor (e.g. YAG has a RI≈1.8). When compared to silicone (RI≈1.4 to 1.5), such glass compositions minimize the RI difference between the matrix material and the phosphor, and therefore may increase the efficiency of the LED package.

While not being bound to any particular theory, it is believed that if the phosphor and the matrix material have largely divergent refractive indices, then there may be an increase in light scattering at the phosphor-matrix interfaces. Such scattering may contribute to a reduction in the level of output for the LED package. Conversely, a reduction in the refractive index difference between the matrix material and the phosphor may increase efficiency of light transmittance through the phosphor-containing layer because scattering of light may be reduced at such interfaces.

In this respect, a glass matrix offers a more closely matched refractive index to phosphor than does a polymer matrix of organic silicone. In addition the glass matrix may be transparent to both visible light as well as part of the UV spectrum, and more chemically and temperature resistant than organic silicone used as a polymer matrix. In one embodiment, the glass composition comprises a UV absorbing glass.

Glass Frit

In accordance with the present subject matter, the glass compositions can be in the form of glass frit having a certain particle size distribution. The glass frit can be formed by quenching the molten oxides to form a glass composition, which can be modified, such as by grinding or milling for example, to produce glass frit having a desired particle size distribution. The glass frit (either crystallizing or non-crystallizing) can be dispersed in a conventional organic LED encapsulant, formed as a separate phosphor-containing layer optionally positioned over a conventional LED encapsulant, or used as an encapsulant or cover layer without using a conventional LED encapsulant. The glass frit can also be applied to various substrates and fired for use as an enamel coating or functional coating on various optical devices, such as windows, displayer screens, smartphones, tablets, or the like.

The average size of the glass frit particles is not particularly limited, and in any embodiment may range from submicron size (for example 100 nm) to about 50 microns, or from about 1 micron to about 30 microns, or from 3 microns to about 30 microns. In any embodiment, the frit particles range in average size from about 3-25 microns, more preferably 5-20 microns. In embodiments where the phosphor-containing layer comprises a disc (FIGS. 1 and 3), the average particle size of the glass frit can range from about 8 to 30 microns. Experiments have clearly demonstrated increased transmittance through pellets pressed from coarser particles than from ones pressed from finer particles. It is speculated that a coarse particle size allows entrapped air between the frit to more easily escape during sintering, and thus allows the glass particles to more completely fuse together. This increased fusing of glass frit reduces the number of interfaces in the bulk of the glass matrix material and thereby reduces the amount of haze exhibited by the phosphor-containing layer.

Additives

In accordance with the present subject matter, various additives can be added to the glass frit before sintering the frit to form the phosphor-containing layer. Such additives may be included to adjust certain properties of the phosphor-containing layer, such as increasing light transmittance for example.

Glass frit has been used for many decades, especially in glass enamel applications for decorative purposes for bottles and tumblers, and for more functional purposes such as automotive window enamels. In these applications, the glass frit is formed into a layer and heated (i.e. sintered) to a temperature above its Tg or to a softening temperature above its Tg, so that it has some limited flow and leveling properties, and so the frit particles soften and fuse to form an enamel layer. However, due to substrate temperature limitations or due to the desire to not have the green body lose its shape, the glass frit is generally not heated to a temperature where it attains a low viscosity, and thus the frit does not become fluid enough to allow for complete evolution of trapped bubbles at the interfaces of the sintered particles in the molten mass. As such, some amount of air bubbles remains in the sintered enamel layer.

The presence of air bubbles is one of the primary causes of opacity in the sintered glass matrix. The bubbles/voids remaining in the enamel layer cause light scattering within the enamel, which contributes some opacity to the enamel. Some applications, such as window glass or display screens, require much greater transparency than is typically obtained with these standard glass enamels. However, since the enamel layer is being generated from packed glass frit and not from a fluid glass, it is difficult to eliminate light-scattering bubbles and attain high transparency.

In several embodiments, certain powders are added to the glass frit to reduce the amount and/or size of entrapped air bubbles in the glass matrix, which improves light transmittance through the sintered phosphor-containing layer. In one embodiment, metal oxide powder is added to the glass frit before sintering. The metal oxide powder can comprise nano-sized particles having a refractive index similar to that of the glass frit, and can include for example, nano-sized particles of silica, alumina, zircon, zirconium oxide, titanium oxide, zinc oxide, mullite, cordierite, or the like and combinations thereof.

The metal oxide powder can also comprise fumed metal oxide powder, such as fumed silica, fumed alumina, fumed titanium oxide, fumed zinc oxide, or the like and combinations thereof. The average size of the metal oxide powder in the largest dimension can range from about 0.01-5.0 microns, from about 0.1-3.0 microns, or from about 0.2-0.3 microns. Exemplary powders include Aerosil 150 fumed silica or Aerosil 380 fumed silica, both from Evonik Industries; and Cabosil M5 fumed silica from Cabot Corporation, for example.

The metal oxide powder can be included in, (such as dispersed in) the crystallizing glass compositions or non-crystallizing glass compositions including phosphor, in a range from about 0.1-5.0 weight percent (wt %), preferably 0.1-3.0 wt %. In another aspect, the metal oxide powder is included in a range from about 0.2-2.0 wt %, or from about 0.6-0.8 wt %.

In several embodiments, the metal oxide powder is dry mixed to be substantially uniformly dispersed in the glass frit. That is, the metal oxide powder is substantially evenly distributed by dry mixing and is not significantly agglomerated, collected, concentrated, or otherwise grouped in one region within the glass frit.

While not being bound to any particular theory, it is believed that such metal oxide powder helps with the flow and packing of the glass and phosphor particles so that less air is entrapped, and that during heating the metal oxide powder only slowly dissolves or incompletely dissolves in the sintering glass frit. However, before the metal oxide powder completely dissolves, the powder provides pathways between frit particles that allow air to escape from the bulk of the sintering glass frit and thereby reduces the number and/or size of bubbles in the bulk of the sintered phosphor-containing layer. As the amount of air in the phosphor-containing layer is reduced, transparency of the layer may increase.

In one embodiment, the metal oxide powder has a refractive index ranging from about 1.5-1.8. In another embodiment, the RI of the metal oxide powder is about ±0.01-0.3 of the RI of the glass matrix.

In one embodiment, the powder is free of intentionally added ZnO (RI of 2.01) and/or $TiO_2$ (RI of 2.7), and/or other metal oxide powders that have a relatively high index of refraction, e.g. having a RI greater than about 0.3 compared to the refractive index of the glass matrix. While not being bound to any particular theory, it is believed that any undissolved metal oxide powder having such a high RI, may cause light scattering at the interface between the glass matrix and the undissolved metal oxide powder due to the large refractive index difference between them. This increased light scattering may result in decreased light transmittance through the phosphor-containing layer and may cause a decrease in efficiency of the LED package.

Phosphor-Containing Layer

The present subject matter includes making a glass frit composite, which includes glass frit, optional additives, and in the case of non-crystallizing glass frit, also includes phosphor. The present subject matter also includes separate phosphor added to crystallizing glass frit. In several embodiments, the glass frit composite is formed into a green body and sintered to produce a phosphor-containing layer or phosphor-containing material comprising phosphor dispersed in a glass matrix. The glass frit or phosphor-containing material can be dispersed in a conventional LED encapsulant material comprising phosphor dispersed in a polymer matrix. Alternatively, the glass frit can be applied to a substrate and sintered to produce a glass enamel coating on the substrate, which may be incorporated into various optical devices act as a functional layer.

The phosphor-containing layer or material is not particularly limited by the present subject matter, and can have a phosphor loading of from 5-95 wt %. The phosphor-containing layer can have a thickness ranging from about 0.01-5 mm, which may be dependent on the amount of phosphor in the layer. The phosphor-containing layer can have transparency of at least 40% when measured at a thickness of about 1 millimeter at a light wavelength of 550 nm.

The phosphor-containing material or glass frit may be included in a LED package as a phosphor-containing cover layer (FIGS. 1 and 3), as an encapsulant (FIG. 2), or dispersed in a conventional LED encapsulant for example. Other configurations and applications are also possible in accordance with the present subject matter.

Methods

In accordance with the present subject matter, exemplary methods are provided for making a phosphor-containing layer. Such phosphor-containing layers may be suitable for use in a LED package for converting blue light from a blue LED chip, to white light of various color temperatures, or for other applications as discussed herein. The present subject matter also includes methods of making a LED package including a phosphor-containing layer as a cover layer remote from the LED chip (FIGS. 1 and 3), or as an encapsulant for the LED chip (FIG. 2).

One exemplary method includes providing glass frit, which can be made by mixing and melting various oxides as previously described herein. The melt is then quenched to form a glass composition, which is then processed, by milling or grinding for example, to produce glass frit of a desired size. The glass frit may be combined with various additives, such as nano-sized metal oxide powder, to form a glass frit composite. In the case of non-crystallizing glass, phosphors may be combined with the glass frit to form a glass frit composite. The glass frit composite is then fashioned into a green body and sintered to produce a phosphor-containing layer having a desired shape and size, e.g. a disc (FIGS. 1 and 3) or encapsulant layer (FIG. 2).

In aspects where the glass frit composite includes non-crystallizing glass frit, then the method includes adding phosphor to the glass frit composite so that the resulting sintered product contains phosphor. In aspects where the glass frit composite includes crystallizing glass frit, then the process of sintering the green body, or other heat treatments, will cause the phosphor crystals to precipitate in the composite so that the resulting sintered product contains phosphor. In the case of a crystallizing glass frit, the pre-sintered powder composite may also contain seed materials of $Ce^{3+}$ doped garnet phosphors, nitride and oxynitride phosphors, and oxide, oxyhalide and halide phosphors; including, but not limited to: $Y_3Al_5O_{12}:Ce^{3+}$ (Ce:YAG); $Y_3Al_5O_{12}:Ce^{3+}$, $CaS:Eu_2+$; $Y_3Al_5O_{12}:Ce^{3+}$, $Sr_2Si_5N_8:Eu^{2+}$; $Sr_2GaS_4:Eu^{2+}$, $SrS:Eu^{2+}$; $Sr_2GaS_4:Eu^{2+}$, $(Ca,Sr)S:Eu^{2+}$; $Ca_3Sc_2Si_3O_{12}$: $Ce^{3+}$, $CaAlSiN_3:Eu^{2+}$; $SrSi_{22}O_2N_2:Eu^{2+}$, $Sr_2Si_5N_8:Eu^{2+}$; $SrSi_2O_2N_2:Eu^{2+}$, $CaSiN_2:Ce^{3+}$; $(Sr,Ca)_3(Al,Si)O_4(O,F)$: $Ce^{3+}$, $K_2TiF_6:Mn4+$; $BaSi_2O_2N_2:Eu^{2+}$, β-SiAlON:$Eu^{2+}$, Ca-α-SiAlON: $Eu^{2+}$, $CaAlSiN_3:Eu^{2+}$; $BaSi_2O_2N_2:Eu^{2+}$, β-SiAlON:$Eu^{2+}$, Ca-α-SiAlON:$Eu^{2+}$, $CaAlSiN_3:Eu^{2+}$; $BaMgAl_{10}O_{17}:Eu^{2+}$, $Ca_9La(PO_4)_7:Eu^{2+},Mn^{2+}$; $CaSi_2O_2N_2$: $Eu^{2+}$; $Sr_5Al_{5+x}Si_{21-x}N_{35-x}O_2+x:Eu^{2+}$ (with x~0); $SrAlSi_4N_7:Eu^{2+}$; $Ba_2AlSi_5N_9:Eu^{2+}$; $Ba_3Si_6O_{12}N_2:EU^{2+}$; $Ba_2SiO_4:EU^{2+}$; $Sr_2LaAlO_5:Ce^{3+}$; $Sr_3SiO_5:Ce^{3+}$; $M_2SiO_4$: $Eu^{2+}$ (with M =$Ba^{2+}$, $Sr^{2+}$, $Ca^{2+}$); and combinations thereof. The seed materials may have an average particle size of 0.1 to 10 microns, preferably 0.2 to 4 microns, and more preferably 0.3 to 1 micron.

The methods include forming the glass frit composite into a green body having a desired shape and size. In one embodiment, the method includes applying the glass frit composite to a substrate before sintering. In one aspect, tape casting techniques are used, wherein the glass frit composite comprises a casting slip material including solvent, dispersant, and a binder. The binder can comprise a polymeric material and optionally additional additives such as plasticizers. The casting slip can be applied to a flexible substrate (e.g. filmic substrates such as polymer films) and sintered thereon to form the phosphor-containing layer in the form of a tape. Thereafter, the phosphor-containing layer can be sized, such as by cutting, and/or removed from the flexible substrate for incorporating into a LED package. The polymer films to which the casting slip is applied are not particularly limited, and can include polymers such as polyethylene, polypropylene, polyester, nylon, polyvinyl chloride, or combinations thereof. The polymer films can include plasticizers or other additives. In one embodiment, the polymer film and/or casting slip includes a phthalate-free plasticizer. Such phthalate-free plasticizers can include benzoate plasticizers, such as dipropylene glycol dibenzoate, diethylene glycol dibenzoate, triethylene glycol dibenzoate, or the like. In one aspect, the polymer film and/or casting slip is phthalate-free. In accordance with the present subject matter, the glass frit composite can be applied by other techniques and sintered on other substrates, which can include rigid substrates such as glass (boro-float, window glass, Gorilla glass) or tiles, and incorporated along with the substrate into various optical devices including into an LED package.

In another embodiment, the method includes forming the glass frit composite into a green body by pressing the glass frit composite using a die or hydraulic press. The green body can be shaped to almost any desired shape, such as a disc or other shaped object. The green body can then be sintered to form a phosphor-containing layer. Various pressing and sintering methods can be used, such as cold pressing, or isostatic pressing the glass frit composite, which may include a binder for green strength, into a green body. The green body can then be sintered by heating the green body. Alternatively, the methods can include hot-pressing the glass frit composite, which includes simultaneously pressing and heating to shape and sinter the glass frit composite to form the phosphor-containing layer. In these pressing and sintering methods, the shape or size of the resulting phosphor-containing layer can thereafter be modified by laser cutting, grinding, polishing or other techniques.

In another exemplary method, the green body can be produced by applying the glass frit composite to a substrate by methods including digital printing, screen printing, coating using a doctor blade, tape casting, foil casting, 3D printing, spraying (both dry spraying, such as electrostatic spraying, and wet spraying) or by dipping; and then sintering the glass frit composite by heating. For these application methods, the glass frit composite can include for example, solvent, dispersant, and a binder as desired. In these exemplary methods, the glass frit composite can be applied and sintered as a remote cover layer on the LED device (FIGS. 1 and 3) such as by forming the phosphor-containing layer over a conventional organic silicone encapsulant on an LED package (FIG. 3).

The glass frit composite can be sintered into a monolithic structure by different methods, including conventional furnace firing, fast firing techniques such as microwave sintering, IR lamp heating; different additive manufacturing techniques such as selective laser sintering.

In various aspects, a glass frit composite can be used in a layered construction, including alternating different layers of sintered glass frit and phosphor, to give desired optical properties. In one exemplary construction, alternating layers of glass+phosphor having different amounts and types of glass, having different amounts and types of phosphors dispersed therein can be formed, so that overall optical properties of the coating can be tailored to desired level. For example, the various layers can each be tailored to produce a multi-layer construction that more efficiently reflects light, transmits light, and/or converts the color tone of the light that is reflected or transmitted. This layered construction can then be incorporated into various optical devices, such as a cover layer in an LED package.

In another embodiment, methods include dispersing glass frit and phosphors in a polymer matrix, such as conventional organic silicone. The dispersion, including glass frit, phosphor, and a polymer matrix, can be formed into an encapsulant or cover layer for an LED package, wherein the glass frit may improve the lifetime of the conventional silicone-based phosphor layer by reducing the degradation of the organic silicone polymer matrix. One aspect of this embodiment is shown in FIG. 2 for example, wherein the encapsulant 70 for the LED chip 20 includes a dispersion of glass frit, phosphor, and an organic polymer matrix. As shown, the encapsulant 70 including the dispersion of glass frit, phosphor, and a polymer matrix can be in the form of a dome 71 or other shape.

The methods may also include pre-sintering the glass frit and phosphor to reduce scattering losses at the glass frit/phosphor interfaces. The pre-sintered glass frit and phosphor can be subsequently sintered into an enamel coating on a substrate, a cover glass disc, or an encapsulant. Pre-sintering may promote favorable interactions at glass frit/phosphor boundaries so that richer color shades can be achieved. Pre-sintering may be achieved by heating the glass frit and phosphor composition to a temperature below the softening point of the glass frit.

It is also envisioned that mixtures of glass powders having different compositions and/or particle sizes can be added to form glass composites of desired overall composition and properties suitable for LED cover glass composite.

Further applications include various display panels such as plasma display panels, LCD display panels, and other television or computer screen panels. The compositions and methods of the invention are also applicable to display panels mentioned above in aviation, consumer electronics, automobiles, including driverless cars, parts or devices produced by additive manufacturing such as 3D printing,

EXAMPLES

The following examples are provided to generally illustrate various embodiments in accordance with the present subject matter, and should not be construed to limit the present subject matter.

A number of lead, bismuth and zinc glasses were analyzed (Table 2) for use in accordance with the present subject matter. Also considered were barium, magnesium and calcium glasses. The analysis was limited to three major glass systems—lead, bismuth, and zinc based glass systems, due to the desire to have sintering temperatures of glass+phosphor composite lower than 900° C. Although lead glass can have higher refractive index and lower firing temperatures compared to bismuth or zinc glasses, it may be desirable to develop lead-free, cadmium-free glasses to avoid hazardous constituents.

A number of bismuth glasses based on bismuth-zinc-silicates and bismuth-zinc-borates glass systems were analyzed. These bismuth glasses tend to crystallize (note that this is different from intentionally crystallizing phosphor phases such as YAG crystals) and the crystals tend to produce a yellowish brown tint that is characteristic of crystallized bismuth glasses. However, various embodiments of the invention involve a light emitting diode package wherein prior to sintering, the glass frit composite is free of intentionally added phosphors. Alternately, the glass frit composite may include intentionally added phosphors.

A number of alkali-ZnO—$B_2O_3$—$SiO_2$ glasses were analyzed. The inventors have identified several glasses and screened the glasses based on transparency that could be achieved in 1 mm thick discs. These alkali-ZnO≠$B_2O_3$—$SiO_2$ glasses as shown in Table 2 to have RI~1.55 to 1.60.

In accordance with the present subject matter, Table 2 below shows various oxide additions that may be suitable to make glass frit for use in accordance with the present subject matter. The glass frit was formed by mixing the listed mole % of the oxides and additives as noted in Table 2, which were then fired to form a glass melt and quenched and sized to form a glass frit. The glass frit (or mixture of glass frits) was formed and sintered to produce 1 mm thick discs. The refractive index (RI) and softening points in degrees Celsius (SPT, ° C.) are noted for each example. Example 1 is lists the glass frit as EG 2934, which is an alkali bismuth-zinc boro-silicate glass commercially available from Ferro Corporation, Mayfield Heights, Ohio. Example 2 lists the glass frit as EG 2964, which is bismuth-zinc-boro-silicate glass commercially available from Ferro Corporation. Example 3 lists the glass frit as EG3030, which is a bismuth-zinc-borate glass commercially available from Ferro Corporation. Example 4 lists the glass frit as S404H, which is a zinc-boro-alumino-silicate glass having 62.5 mole % PbO. The column labeled "$R_2O$", represents the amount of alkali metal oxides, wherein the "R" represents one or more alkali metals, e.g. Li+Na+K+Rb+Cs+Fr. The column labeled "RO", represent the amount of alkaline earth metal oxides, wherein the "R" represents one or more alkaline earth metals, e.g. Be+Mg+Ca+Sr+Ba+Ra. It is noted that the amount of oxides in each example may not add up to 100 mole % due to rounding. However, it is understood that the total composition for each example includes 100 mole %.

Alumino-borosilicate glass frits are also suitable as the glass frits of the present subject matter. The alumino-borosilicate glass frits useful herein have about 5-35 mol % $Al_2O_3$, about 10-50 mol % $B_2O_3$ and about 5-45 mol % $SiO_2$. Other amounts of these oxides disclosed elsewhere herein may be combined to form suitable alumino-borosilicate glass frits.

TABLE 3

| No. | Grind | Lot | Wt % | Name | Type | % T |
|---|---|---|---|---|---|---|
| 18 | 15-20 μm | A | None | n/a | n/a | 66.1 |
| 19 | 15-20 μm | A | 0.5 | M5 | $SiO_2$ | 67.8 |
| 20 | 15-20 μm | A | 1.3 | M5 | $SiO_2$ | 67.4 |
| 21 | 15-20 μm | B | None | n/a | n/a | 59.6 |
| 22 | 15-20 μm | B | 0.2 | M5 | $SiO_2$ | 59.5 |

TABLE 2

| | | | | | | Oxide Mole % | | | | | | | | | | | Traits | |
|---|---|---|---|---|---|---|---|---|---|---|---|---|---|---|---|---|---|---|
| No. | $SiO_2$ | ZnO | $B_2O_3$ | $R_2O$ | RO | $Sb_2O_3$ | $Al_2O_3$ | $Y_2O_3$ | $La_2O_3$ | $Bi_2O_3$ | $TeO_2$ | $TiO_2$ | $ZrO_2$ | $Ta_2O_5$ | $Nb_2O_5$ | F | RI | SPT, ° C. |
| 1 | | | | EG 2934 | | | | | | | | | | | | | 1.82 | 444 |
| 2 | | | | EG 2964 | | | | | | | | | | | | | 1.82 | 510 |
| 3 | | | | EG 3030 | | | | | | | | | | | | | 1.86 | 386 |
| 4 | | | | S404H | | | | | | | | | | | | | 2.00 | 355 |
| 5 | 49.1 | 16.9 | 18.7 | 12.9 | 1.3 | 0.4 | 0.8 | | | | | | | | | | 1.53 | 603 |
| 6 | 43.2 | 18.8 | 20.9 | 14.4 | 1.5 | 0.4 | 0.9 | | | | | | | | | | 1.55 | 597 |
| 7 | 21.0 | 26.1 | 20.9 | 11.2 | | | 1.9 | | | | | 3.2 | 2.6 | | | 13.3 | 1.60 | 552 |
| 8 | 41.3 | 17.9 | 19.9 | 13.8 | 1.4 | 0.4 | 0.9 | 4.5 | | | | | | | | | 1.60 | 567 |
| 9 | 39.1 | 17.0 | 18.9 | 13.0 | 1.4 | 0.4 | 0.8 | | 9.5 | | | | | | | | 1.64 | 576 |
| 10 | 41.3 | 17.9 | 19.9 | 13.7 | 1.4 | 0.4 | 0.9 | | | | 4.6 | | | | | | 1.56 | 558 |
| 11 | 36.3 | 15.8 | 17.5 | 12.1 | 1.3 | 0.3 | 0.8 | | | | | 16.1 | | | | | 1.60 | 576 |
| 12 | 38.5 | 16.7 | 18.6 | 12.8 | 1.3 | 0.4 | 0.8 | | | | | | 11.0 | | | | 1.56 | 582 |
| 13 | 41.8 | 18.2 | 20.2 | 13.9 | 1.4 | 0.4 | 0.9 | | | | | | | 3.4 | | | 1.59 | 578 |
| 14 | 39.8 | 17.3 | 19.2 | 13.2 | 1.4 | 0.4 | 0.8 | | | | | | | | 8.0 | | 1.58 | 567 |
| 15 | 37.8 | 16.4 | 18.2 | 12.6 | 1.3 | 0.3 | 0.8 | | | | | | | | 12.6 | | 1.74 | 608 |
| 16 | 40.0 | 17.4 | 19.3 | 13.3 | 1.4 | 0.4 | 0.8 | | | 7.6 | | | | | | | 1.62 | 547 |
| 17 | 37.1 | 16.1 | 17.9 | 12.4 | 1.3 | 0.3 | 0.8 | | | 14.1 | | | | | | | 1.80 | 546 |

The above identified Example Nos. 1-17 are provided as models, and should not be construed to limit the present subject matter.

The inventors have also prepared examples including a mixture of glass frit (or mixtures of glass frits) and nano-powder additives, which were included for increasing the transparency of glass frit formed at lower temperatures (for example, less than 700° C.). The glass frit and additive were loaded into a die and pressed with a hydraulic press to form a green (non-fired) pellet. The green pellet was sintered in a furnace at a temperature above the Tg of the glass frit. The transparency of the pellets including the nano-powder additive, were analyzed against pellets without the nano-powder additives.

Tables 3-7 below, show the size (i.e. grind) of the glass frit used for each example. All pellets in Tables 3-7 are made from the same type of glass but come from different lots as indicated. Further, Tables 3-7 include pellets having no additive, which are used as standards/controls for comparison. The additive name and type are indicated, along with the percent transmittance (% T) for each example. Replicate pellets were made, fired, and measured in some cases to verify reproducibility.

The analysis of the examples consisted of pressing a powder mix, comprising of at least one glass frit and an additive as indicated in the tables, in a dye on a hydraulic press to form a green (non-fired) pellet; firing the green pellet in a furnace at a temperature above the Tg of the lowest temperature glass frit in the powder mix; and measuring the % T (% Transmittance) of the fired pellet.

Based on analysis of pellets of different thicknesses, actual % T values were normalized to correspond to the percent light transmission for a 1 mm thick pellet.

TABLE 3-continued

| No. | Grind | Lot | Wt % | Name | Type | % T |
|---|---|---|---|---|---|---|
| 23 | 15-20 μm | B | 0.2 | M5 | $SiO_2$ | 60.0 |
| 24 | 15-20 μm | B | 0.3 | M5 | $SiO_2$ | 63.4 |
| 25 | 15-20 μm | B | 0.5 | M5 | $SiO_2$ | 64.5 |
| 26 | 15-20 μm | B | 0.5 | A380 | $SiO_2$ | 65.0 |
| 27 | 15-20 μm | B | 0.8 | M5 | $SiO_2$ | 68.2 |
| 28 | 15-20 μm | B | 1.0 | M5 | $SiO_2$ | 61.4 |
| 29 | 15-20 μm | B | 2.0 | M5 | $SiO_2$ | 39.8 |
| 30 | 15-20 μm | B | 4.0 | M5 | $SiO_2$ | 11.9 |

Initially, Cabosil M5 powder (fumed silica, $SiO_2$) available from Cabot Corporation, Midland, Michigan, was analyzed as a dry additive to glass frit at various weight percentages. As can be seen in Table 3, when the amount of M5 powder was above 1 wt % (examples Nos. 28-30), there was no improvement in pellet transparency compared to the glass frit with no additive (example No. 21). In contrast, pellets including less than 1 wt % of the M5 additive showed definitive improvements in pellet transparency. In example No. 26, Aerosil A380 (fumed silica) available from Evonik Industries, Germany, was also analyzed as an additive and shows improvement in transparency over the control (No. 21).

Table 3 shows beneficial effects of Cabosil M5 silica and Aerosil A380 additive in a range between about 0.2 and 2.0 wt % for the specific glass analyzed (EG3046 glass at a size of 15-20 μm). The greatest increase in transparency appears to be at about 0.6-0.8 wt % of additive in this case. However, the useful range of additive may change somewhat with different frit grinds, different glass compositions, and different nano-particle additives. In accordance with the present subject matter, the additive can be added in a range from about 0.1-3.0 wt %.

The analysis of various sintered pellets also included varying the size of the glass frit used to make the pellets. Table 4 below shows results of an analysis for glass frit of different sizes (i.e. Grind).

TABLE 4

| No. | Grind | Lot | Wt % | Name | Type | % T |
|---|---|---|---|---|---|---|
| 31 | 15-20 μm | D | None | n/a | n/a | 59.1 |
| 32 | 15-20 μm | D | 0.6 | M5 | $SiO_2$ | 63.4 |
| 33 | 15-20 μm | E | None | n/a | n/a | 50.1 |
| 34 | 15-20 μm | E | 0.6 | M5 | $SiO_2$ | 60.2 |
| 35 | 15-20 μm | E | 0.7 | M5 | $SiO_2$ | 56.6 |
| 36 | 15-20 μm | F | None | n/a | n/a | 57.3 |
| 37 | 15-20 μm | F | 0.6 | A380 | $SiO_2$ | 64.6 |
| 38 | 3 μm/15-20 μm | G | None | n/a | n/a | 54.9 |
| 39 | 3 μm/15-20 μm | G | 0.5 | M5 | $SiO_2$ | 57.6 |
| 40 | 3 μm/15-20 μm | G | 0.6 | M5 | $SiO_2$ | 58.6 |
| 41 | 9 μm | H | None | n/a | n/a | 54.1 |
| 42 | 9 μm | H | 0.6 | M5 | $SiO_2$ | 58.7 |
| 43 | 9 μm | H | 0.6 | M5 | $SiO_2$ | 57.3 |
| 44 | 9 μm | H | 0.6 | M5 | $SiO_2$ | 56.8 |
| 45 | 9 μm | H | 0.75 | M5 | $SiO_2$ | 56.3 |
| 46 | 9 μm | I | None | n/a | n/a | 43.7 |
| 47 | 9 μm | I | 0.6 | M5 | $SiO_2$ | 49.3 |
| 48 | 9 μm | J | None | n/a | n/a | 38.7 |
| 49 | 9 μm | J | 0.6 | M5 | $SiO_2$ | 41.2 |
| 50 | 3 μm | K | None | n/a | n/a | 47.5 |
| 51 | 3 μm | K | 0.6 | M5 | $SiO_2$ | 50.2 |

Results shown in Table 4 demonstrate the significant effect that fumed silica has on the % T of these sintered pellets. The results show that the improvements are definite for all the different size ranges of glass frit analyzed, as well as glass frit mixtures of more than one grind size (Example Nos. 38-40). Depending on the processing done on the glass powders, the increases in % T ranged from about 2% to 12% when an adequate level of additive was used and when the additive was adequately dispersed in the glass powder. Similar results would be expected for finer and coarser sized grinds of these glass powders as well.

The analysis also included varying the additive used in the sintered pellets. Table 5 below shows analysis results for additives Cabosil M5 (B.E.T. Surface Area=200 $m^2/g$, average aggregate length=0.2-0.3 μ); Aerosil A380 (B.E.T. Surface Area =380 $m^2/g$, mean particle size=0.007 μm); Aerosil A150 (fumed silica, B.E.T. Surface Area=150 $m^2/g$, mean particle size=0.014 μm) available from Evonik Industries, Germany; and Minusil 5 (median particle size=1.7 μm, D50=3 microns) available from US Silica, Fredrick, Md.

TABLE 5

| No. | Grind | Lot | Wt % | Name | Type | % T |
|---|---|---|---|---|---|---|
| 52 | 15-20 μm | B | None | n/a | n/a | 57.7 |
| 53 | 15-20 μm | B | 0.5 | M5 | $SiO_2$ | 64.5 |
| 54 | 15-20 μm | B | 0.5 | A380 | $SiO_2$ | 65.0 |
| 55 | 15-20 μm | B | 0.5 | A150 | $SiO_2$ | 62.7 |
| 56 | 15-20 μm | B | 0.5 | A380 | $SiO_2$ | 63.0 |
| 57 | 15-20 μm | B | 0.5 | A150 | $SiO_2$ | 63.1 |
| 58 | 15-20 μm | B | 0.5 | A380 | $SiO_2$ | 62.1 |
| 59 | 15-20 μm | B | 0.5 | Minusil 5 | $SiO_2$ | 56.8 |

Table 5 shows the improved results from using a variety of nano-sized silica sources. However, the addition of the relatively larger Minusil 5 does not result in improved % T.

Further analysis included using a variety of nano-sized metal oxide powders. Table 6 below, shows results of analyzing % T for pellets including various nano-powder additives, including M5 as previously outlined, and also Aeroxide P25 $TiO_2$ powder (B.E.T. Surface Area=36-65 $m^2/g$, 0.021 μm average particle size) available from Evonik Industries, Germany; Aeroxide Alu C, fumed $Al_2O_3$ powder (B.E.T. Surface Area=100 $m^2/g$, 0.013 μm average particle size) available from Evonik Industries, Germany; Nanotek ZnO powder (B.E.T. Surface Area=10-25 $m^2/g$, 0.04-0.10 μm average particle size) available from Alfa Aesar, Ward Hill, Mass.; and Nanox ZnO powder (B.E.T. Surface Area=17-21 $m^2/g$, 0.05-0.06 μm average particle size) available from Elementis Specialties, Hightstown, N.J.

TABLE 6

| No. | Grind | Lot | Wt % | Name | Type | % T |
|---|---|---|---|---|---|---|
| 60 | 15-20 μm | A | None | n/a | n/a | 62.9 |
| 61 | 15-20 μm | A | 0.5 | M5 | $SiO_2$ | 67.8 |
| 62 | 15-20 μm | A | 0.6 | P25 | $TiO_2$ | 25.7 |
| 63 | 15-20 μm | L | None | n/a | n/a | 59.1 |
| 64 | 15-20 μm | L | 0.6 | M5 | $SiO_2$ | 62.8 |
| 65 | 15-20 μm | L | 0.6 | AlonC | $Al_2O_3$ | 62.0 |
| 66 | 15-20 μm | L | 0.6 | Nanotek | ZnO | 43.4 |
| 67 | 15-20 μm | L | 0.6 | Nanox | ZnO | 48.0 |
| 68 | 15-20 μm | L | 0.6 | P25 | $TiO_2$ | 32.7 |

As shown in Table 6, both the silica (RI=1.55) and alumina nano-powders (RI=1.77) improved the % T values for the sintered pellets, while both ZnO (RI=2.01) and $TiO_2$ nano-powders (RI=2.7) decreased to the % T' values. This lower % T in Example Nos. 62, and 66-68 may be due to scattering effects at the frit-additive interfaces, wherein titanium oxide and zinc oxide have refractive indices further from that of the glass powder (RI=1.55), thus resulting in more interfacial scattering than that produced by the lower refractive index additives, $SiO_2$ and $Al_2O_3$ particles. A higher refractive index glass may show improved transmittance with a higher refractive index nano-powder. Additionally, such high RI additives may be desirable in certain applications.

Further analysis included attempts to more uniformly disperse the nano-powder additive in the glass frit. The following dry mixing methods were employed based on microscopy results, where it appeared that the presence of well-dispersed nano-powders greatly reduced the number of bubbles in the sintered pellets, resulting in the improved transparencies.

As shown below in Table 7, several mechanical dispersing techniques were used and compared to a control (Example No. 69) wherein no mechanical mixer was used. The examples were mixed with a DAC SpeedMixer available from FlackTek Inc., Landrum, S.C.; a Waring Blender available from Conair Corporation, Stamford, Conn.; or a paint shaker; and at various power levels or speeds as indicated.

TABLE 7

| No. | Grind | Lot | Wt % | Name | Type | % T | Mixing Process |
|---|---|---|---|---|---|---|---|
| 69 | 3 μm/15-20 μm | A | None | n/a | n/a | 54.9 | n/a |
| 70 | 3 μm/15-20 μm | A | 0.6 | M5 | $SiO_2$ | 58.6 | DAC 2400 rpm |
| 71 | 3 μm/15-20 μm | A | 0.6 | M5 | $SiO_2$ | 49.2 | Paint shaker 30 min |
| 72 | 3 μm/15-20 μm | L | 0.6 | M5 | $SiO_2$ | 49.3 | Blender-speed 7 |
| 73 | 3 μm/15-20 μm | L | 0.6 | M5 | $SiO_2$ | 58.9 | DAC 2400 rpm |
| 74 | 15-20 μm | L | 0.6 | A380 | $SiO_2$ | 56.4 | Paint shaker 30 min |
| 75 | 15-20 μm | L | 0.6 | A380 | $SiO_2$ | 70.8 | DAC 2400 rpm |
| 76 | 15-20 μm | L | 0.6 | A380 | $SiO_2$ | 53.2 | DAC 3600 rpm |
| 77 | 15-20 μm | L | None | n/a | n/a | 58.8 | n/a |
| 78 | 15-20 μm | L | 0.6 | A380 | $SiO_2$ | 68.0 | DAC 2400 rpm |

TABLE 7-continued

| No. | Grind | Lot | Wt % | Name | Type | % T | Mixing Process |
|-----|-------|-----|------|------|------|-----|----------------|
| 79 | 15-20 μm | L | 0.6 | A380 | SiO$_2$ | 55.1 | DAC 3600 rpm |
| 80 | 15-20 μm | L | 0.6 | A380 | SiO$_2$ | 58.9 | Blender-speed 4 |
| 81 | 15-20 μm | L | 0.6 | A380 | SiO$_2$ | 48.1 | Blender-speed 7 |

It was found that the Cabosil M5 was difficult to disperse in the powder mix, and the Aerosil series of silica was more easily dispersed. Eventually, improvements in the nano-powder dispersion process itself were found to further improve the transparency of the fired glass pellets. The results in table 7 show that relatively mild dispersion, such as dry blending the M5 additive on a paint shaker was not beneficial (Example No. 71). Microscopy of Example No. 71 appeared to show that agglomerates of the M5 additive were inhibiting fusion and coalescence of the glass particles.

Moderate blending at 2400 rpm on a DAC centrifugal SpeedMixer (2×20 seconds) gave the best results (Example Nos. 70, 75), while more vigorous mixing at 3600 rpm was detrimental to the % T' values (Example No. 76).

While not being bound to any particular theory, it is believed that the more vigorous mixing on the DAC (e.g. 3600 rpm) resulted in significant abrasion of the plastic jars, causing particles of the plastic jars to contaminate the powder mix. The plastic particles combust during sintering, releasing air bubbles into the sintered material. The increased bubble formation results in increased light scattering and a corresponding reduction in the % T'.

A similar result was also seen when mixing on a Waring blender, with better results at a power setting of 4 (Example No. 80) rather than at 7 (Example No. 81). Again, contamination from abrasion, this time metallic contamination, is believed to be the problem under these more vigorous mixing conditions.

Other embodiments of the invention are presented in the following Items.

Item 1: A method of making a light emitting diode package comprising:
   sintering a glass frit composite to form a phosphor-containing layer comprising phosphor dispersed in a glass matrix, and
   positioning the phosphor-containing layer such that light from a light emitting diode is is transmitted through the phosphor-containing layer,
   wherein the glass frit composite includes glass frit formed by firing a mixture comprising:
     about 20-60 mole % $SiO_2$,
     about 14-50 mole % ZnO, and
     about 3-28 mole % $B_2O_3$.

Item 2: The method of item 1, wherein the mixture further includes:
   about 1-21 mole % $K_2O$,
   about 1-25 mole% $Na_2O$,
   up to 25 mole % BaO+MgO+CaO+SrO,
   up to 60 mole % $Bi_2O_3+TeO_2+Ta_2O_5+Nb_2O_5+P_2O_5$,
   up to 40 mole % $La_2O_3+Lu_2O_3+Pr_2O_3+Gd_2O_3+Tb_2O_3+Eu_2O_3$,
   up to 25 mole % $TiO_2+ZrO_2$,
   up to 5 mole % $Sb_2O_3+CeO_2+SnO_2$,
   up to 20 mole % $Li_2O+Cs_2O+Rb_2O$,
   up to 40 mole % $Y_2O_3+Al_2O_3$, and
   up to 25 mole % F+S+Se as anion modifiers.

Item 3: The method of item 2, wherein the mixture includes:
   about 33-50 mole % $SiO_2$,
   about 15-20 mole % ZnO,
   about 16-21 mole % $B_2O_3$,
   about 2-5 mole % $K_2O$,
   about 3-7 mole % $Na_2O$,
   up to about 8 mole % $Li_2O$,
   up to about 20 mole % BaO,
   up to about 1.0 mole % $Sb_2O_3$, and
   up to about 19 mole % $Al_2O_3$.

Item 4: The method of item 1, wherein the glass frit composite comprises one or more phosphors.

Item 5: The method of item 4, wherein the glass frit composite contains intentionally added seed material for precipitating phosphor crystals during sintering.

Item 6: The method of item 4, further comprising pre-sintering the glass frit composite.

Item 7: The method of item 2, wherein the glass frit composite contains intentionally added seed material for precipitating phosphor crystals during sintering.

Item 8: The method of item 7, where the seed material has an average particle size of 0.3 to 1.0 micron.

Item 9: The method of item 7, wherein the glass frit composite comprises one or more phosphors.

Item 10: The method of item 7, wherein more than one type of phosphor crystals precipitate and one type includes aluminum garnet structure.

Item 11: The method of item 1, wherein the glass frit composite comprises 0.1-3.0 wt % of dispersed metal oxide nano-powder.

Item 12: The method of item 11, wherein the metal oxide nano-powder comprises fumed metal oxide.

Item 13: The method of item 11, wherein the metal oxide nano-powder has an average size of about 0.01-5.0 microns.

Item 14: The method of item 1, wherein the glass frit composite comprises one or more glass frits.

Item 15: The method of item 1, wherein the glass frit has a particle size of from 3-30 microns.

Item 16: The method of item 1, wherein sintering is performed at less than 1050° C.

Item 17: The method of item 1, further comprising pressing, tape casting, coating using a doctor blade, or printing the glass frit composite.

Item 18: The method of item 17, further comprising machining the phosphor-containing layer.

Item 19: The method of item 17, wherein the glass frit composite is included in a casting slip material and applied to a polymer film, and wherein the casting slip material and the polymer film are phthalate-free.

Item 20: A light emitting diode package comprising a phosphor-containing layer through which light from a light emitting diode is transmitted, the phosphor-containing layer comprising a sintered glass frit composite that includes phosphor dispersed in a glass matrix, the glass frit composite including a glass frit, the glass frit comprising, prior to firing:
   about 20-60 mole % $SiO_2$,
   about 14-50 mole % ZnO,
   about 3-28 mole% $B_2O_3$,
   about 1-21 mole % $K_2O$,
   about 1-25 mole % $Na_2O$,
   up to 25 mole % BaO+MgO+CaO+SrO,
   up to 60 mole % $Bi_2O_3+TeO_2+Ta_2O_5+Nb_2O_5+P_2O_5$,
   up to 25 mole % $La_2O_3+Lu_2O_3+Pr_2O_3+Gd_2O_3+Tb_2O_3+Eu_2O_3$,
   up to 25 mole % $TiO_2+ZrO_2$,
   up to 5 mole % $Sb_2O_3+CeO_2+SnO_2$,
   up to 20 mole % $Li_2O+Cs_2O+Rb_2O$, up to 40 mole % $Y_2O_3+Al_2O_3$, and
up to 25 mole % F+S+Se as anions.

Item 21: The light emitting diode package of item 20, wherein the glass frit composite includes one or more phosphors.

Item 22: The light emitting diode package of item 20, wherein prior to sintering, the glass frit composite is free of intentionally added phosphors.

Item 23: The light emitting diode package of item 20, wherein the phosphor-containing layer has a transparency of at least 40% when measured at a thickness of 1 millimeter.

Item 24: The light emitting diode package of item 20, wherein the phosphor includes more than one phosphor comprising aluminum garnet structure.

Item 25: The light emitting diode package of item 20, wherein the glass matrix has a refractive index of 1.5 to 2.0.

Item 26: The light emitting diode package of item 20, wherein the glass frit composite comprises 0.1-5.0 wt % of dispersed metal oxide nano-powder.

Item 27: The light emitting diode package of item 26, wherein the metal oxide nano-powder comprises fumed metal oxide.

Item 28: The light emitting diode package of item 20, wherein the phosphor-containing layer has a transparency of at least 40% when measured at a thickness of about 1 millimeter.

Item 29: A light emitting diode package comprising a phosphor-containing layer through which light from a light emitting diode is transmitted, the phosphor-containing layer comprising glass frit and phosphor dispersed in a polymer matrix, the glass frit comprising, prior to firing:
about 20-60 mole % $SiO_2$,
about 14-50 mole % ZnO,
about 3-28 mole % $B_2O_3$,
about 1-21 mole % $K_2O$,
about 1-25 mole % $Na_2O$,
up to 25 mole % BaO+MgO+CaO+SrO,
up to 60 mole % $Bi_2O_3+TeO_2+Ta_2O_5+Nb_2O_5+P_2O_5$,
up to 25 mole % $La_2O_3+Lu_2O_3+Pr_2O_3+Gd_2O_3+Tb_2O_3+Eu_2O_3$,
up to 25 mole % $TiO_2+ZrO_2$,
up to 5 mole % $Sb_2O_3+CeO_2+SnO_2$,
up to 20 mole % $Li_2O+Cs_2O+Rb_2O$,
up to 40 mole % $Y_2O_3+Al_2O_3$, and
up to 25 mole % F+S+Se as anions.

Item 30: The package of item 29, wherein the glass frit includes the phosphor.

Item 31: The package of item 29, wherein the glass frit is a UV absorbing frit.

Item 32: The package of item 30 further including an encapsulant for the light emitting diode, the encapsulant including phosphor dispersed in a polymer.

Item 33: A phosphor-containing layer comprising a sintered glass frit composite that includes phosphor dispersed in a glass matrix, the glass frit composite including, prior to sintering, glass frit, the glass frit comprising, prior to firing:
about 20-60 mole % $SiO_2$,
about 14-50 mole % ZnO,
about 3-28 mole % $B_2O_3$,
about 1-21 mole % $K_2O$,
about 1-25 mole % $Na_2O$,
up to 25 mole % BaO+MgO+CaO+SrO,
up to 60 mole % $Bi_2O_3+TeO_2+Ta_2O_5+Nb_2O_5+P_2O_5$,
up to 25 mole % $La_2O_3+Lu_2O_3+Pr_2O_3+Gd_2O_3+Tb_2O_3+Eu_2O_3$,
up to 25 mole % $TiO_2+ZrO_2$,
up to 5 mole % $Sb_2O_3+CeO_2+SnO_2$,
up to 20 mole % $Li_2O+Cs_2O+Rb_2O$,
up to 40 mole % $Y_2O_3+Al_2O_3$, and
up to 25 mole % F+S+Se as anions.

Item 34: An optical device including the phosphor-containing layer of item 33, wherein at least one of the following is satisfied,
i) light from the optical device is transmitted through the phosphor-containing layer,
ii) light from the optical device is reflected by the phosphor-containing layer.

Item 35: The optical device including the phosphor-containing layer of item 34, further including one or more other phosphor-containing layers.

Many other benefits will no doubt become apparent from future application and development of this technology.

All patents, applications, standards, and articles noted herein are hereby incorporated by reference in their entirety.

The present subject matter includes all operable combinations of features and aspects described herein. Thus, for example if one feature is described in association with an embodiment and another feature is described in association with another embodiment, it will be understood that the present subject matter includes embodiments having a combination of these features.

As described hereinabove, the present subject matter solves many problems associated with previous strategies, systems and/or devices. However, it will be appreciated that various changes in the details, materials and arrangements of components, which have been herein described and illustrated in order to explain the nature of the present subject matter, may be made by those skilled in the art without departing from the principle and scope of the claimed subject matter, as expressed in the appended claims.

The invention claimed is:

1. A method of making a light emitting diode package comprising:
    sintering a glass frit composite to form a phosphor-containing layer comprising phosphor dispersed in a glass matrix, and
    positioning the phosphor-containing layer such that light from a light emitting diode is transmitted through the phosphor-containing layer,
    wherein the glass frit composite includes glass frit formed by firing a mixture comprising:
        about 20-60 mole % $SiO_2$,
        about 14-50 mole % ZnO, and
        about 3-28 mole % $B_2O_3$, and
    wherein the glass frit composite further comprises 0.1-3.0 wt % of dispersed metal oxide nano-powder.

2. The method of claim 1, wherein the mixture further includes:
    about 1-21 mole % $K_2O$,
    about 1-25 mole % $Na_2O$,
    up to 25 mole % BaO+MgO+CaO+SrO,
    up to 60 mole % $Bi_2O_3+TeO_2+Ta_2O_5+Nb_2O_5+P_2O_5+V_2O_5$,
    up to 25 mole % $La_2O_3+Lu_2O_3+Pr_2O_3+Gd_2O_3+Tb_2O_3+Eu_2O_3$,
    up to 25 mole % $TiO_2+ZrO_2$,
    up to 5 mole % $Sb_2O_3+CeO_2+SnO_2$,
    up to 20 mole % $Li_2O+Cs_2O+Rb_2O$,
    up to 40 mole % $Y_2O_3+Al_2O_3$, and
    up to 25 mole % F+S+Se.

3. The method of claim 1, wherein the mixture includes:
    about 33-50 mole % $SiO_2$,
    about 15-20 mole % ZnO,
    about 16-21 mole % $B_2O_3$, about 2-5 mole % $K_2O$,
about 3-7 mole % $Na_2O$,
up to about 8 mole % $Li_2O$,
up to about 20 mole % BaO,
up to about 1 mole % $Sb_2O_3$, and
up to about 19 mole % $Al_2O_3$.

4. The method of claim 1, wherein the glass frit composite comprises one or more phosphors.

5. The method of claim 1, wherein the glass frit composite contains intentionally added seed material for precipitating phosphor crystals during sintering.

6. The method of claim 5, where the seed material has an average particle size of 0.1 to 10 micron.

7. The method of claim 5, wherein more than one type of phosphor crystals precipitate and one type includes aluminum garnet structure.

8. The method of claim 1, further comprising pre-sintering the glass frit composite.

9. The method of claim 1, wherein the metal oxide nano-powder has an average size of about 0.01-5.0 microns.

10. The method of claim 1, wherein the glass frit has a particle size of from 0.1 to 50 microns.

11. The method of claim 1, wherein sintering is performed at less than 1050° C.

12. The method of claim 1, wherein:
the glass frit composite is included as part of a casting slip material including solvent, dispersant, and a binder,
the method further comprises applying the casting slip material to a flexible substrate, and drying the casting slip material in the form of a tape on the flexible substrate,
sintering includes sintering the tape to form the phosphor-containing layer comprising phosphor dispersed in a glass matrix.

13. The method of claim 1, wherein the phosphor comprises Yttrium Aluminum Garnet.

14. The method of claim 1, wherein the dispersed metal oxide nano-powder has a B.E.T. surface area of 100-380 $m^2/g$.

15. The method of claim 1, wherein the dispersed metal oxide nano-powder has a mean particle size of 0.007 μm to 0.1 μm.

16. A method of making a light emitting diode package comprising:
sintering a glass frit composite to form a phosphor-containing layer comprising phosphor dispersed in a glass matrix, and
positioning the phosphor-containing layer such that light from a light emitting diode is transmitted through the phosphor-containing layer,
wherein the glass frit composite includes glass frit formed by firing a mixture comprising:
about 20-60 mole % $SiO_2$,
about 15.8-50 mole % ZnO, and
about 3-28 mole % $B_2O_3$.

17. A method of making a light emitting diode package comprising:
sintering a glass frit composite to form a phosphor-containing layer comprising phosphor dispersed in a glass matrix, and
positioning the phosphor-containing layer such that light from a light emitting diode is transmitted through the phosphor-containing layer,
wherein the glass frit composite includes glass frit formed by firing a mixture comprising:
about 20-60 mole % $SiO_2$,
about 14-50 mole % ZnO, and
about 3-28 mole % $B_2O_3$,
wherein the glass frit composite contains intentionally added seed material for precipitating phosphor crystals during sintering.

18. The method of claim 17, wherein more than one type of phosphor crystals precipitate and one type includes aluminum garnet structure.

* * * * *